United States Patent
Van Den Berg et al.

(10) Patent No.: US 9,537,446 B2
(45) Date of Patent: Jan. 3, 2017

(54) SYSTEM FOR PRODUCING A SYSTEM CLOCK AND TEMPERATURE GRADIENT DETECTION SYSTEM

(71) Applicant: ALCATEL LUCENT, Paris (FR)

(72) Inventors: Eric Van Den Berg, Nijlen (BE); Bart Pauwels, Tessenderlo (BE)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 14/416,467

(22) PCT Filed: Aug. 19, 2013

(86) PCT No.: PCT/EP2013/067212
§ 371 (c)(1),
(2) Date: Jan. 22, 2015

(87) PCT Pub. No.: WO2014/029718
PCT Pub. Date: Feb. 27, 2014

(65) Prior Publication Data
US 2015/0180409 A1    Jun. 25, 2015

(30) Foreign Application Priority Data
Aug. 21, 2012   (EP) ................... 12306012

(51) Int. Cl.
  *H03L 7/06*   (2006.01)
  *H03B 5/04*   (2006.01)
  (Continued)

(52) U.S. Cl.
  CPC ........ *H03B 5/04* (2013.01); *G01K 7/00* (2013.01); *H03B 5/30* (2013.01); *H03L 1/022* (2013.01); *H03L 7/099* (2013.01)

(58) Field of Classification Search
  CPC ...... H03L 7/087; H03L 2207/50; H03L 7/095; H03L 7/107; H03L 7/18
  (Continued)

(56) References Cited

U.S. PATENT DOCUMENTS 5,200,714 A * 4/1993 Hayashi ............... H03L 1/028
                                                        310/315
6,711,230 B1   3/2004 Nicholls et al.
(Continued)

FOREIGN PATENT DOCUMENTS

JP   H03251912 A   11/1991
JP   2008177765 A   7/2008
(Continued)

OTHER PUBLICATIONS

International Search Report PCT/ISA/210 for International Application No. PCT/EP2013/067212 Dated Oct. 10, 2013.
(Continued)

Primary Examiner — Lincoln Donovan
Assistant Examiner — Diana J Cheng
(74) Attorney, Agent, or Firm — Harness, Dickey & Pierce, P.L.C.

(57) ABSTRACT

System for producing a system clock signal comprising a local oscillator configured to generate a first clock signal; a temperature detector configured to detect a temperature change above a critical value in an area including the local oscillator; an obtaining module configured to obtain a second clock signal; a clock generator configured to generate the system clock signal in a first manner, using the first clock signal, in a normal mode when the temperature detector does not detect a temperature change above the critical value, and in a second manner different from the first manner, using the second clock signal, in a reverse hold-over mode when the temperature detector has detected a temperature change above the critical value.

14 Claims, 3 Drawing Sheets

(51) Int. Cl.
*H03L 1/02* (2006.01)
*G01K 7/00* (2006.01)
*H03B 5/30* (2006.01)
*H03L 7/099* (2006.01)

(58) Field of Classification Search
USPC .................................................. 327/156–159
See application file for complete search history.

(56) References Cited

U.S. PATENT DOCUMENTS

| | | | |
|---|---|---|---|
| 7,167,993 B1 | 1/2007 | Thomas et al. | |
| 7,764,133 B1 | 7/2010 | Nicholls | |
| 8,525,840 B2 * | 9/2013 | Hendry | ............... G06F 1/08 |
| | | | 345/501 |
| 2007/0182467 A1 | 8/2007 | Nakamuta | |
| 2012/0286880 A1 | 11/2012 | Kowada | |

FOREIGN PATENT DOCUMENTS

| | | |
|---|---|---|
| JP | 2012060583 A | 3/2012 |
| WO | WO-2011086976 A1 | 7/2011 |

OTHER PUBLICATIONS

Written Opinion of the International Searching Authority PCT/ISA/237 for International Application No. PCT/EP2013/067212 Dated Oct. 10, 2013.

* cited by examiner

SYSTEM FOR PRODUCING A SYSTEM CLOCK AND TEMPERATURE GRADIENT DETECTION SYSTEM

TECHNICAL FIELD

Embodiments of the invention relate to the field of systems and methods for producing a system clock. Further embodiments of the invention relate to the field of temperature gradient detection systems and methods.

BACKGROUND

Time synchronization or clock distribution in a timing dependent system or network, e.g. a telecommunications network, is usually subject to very strict specifications for frequency stability, e.g. as specified in ITU-T recommendations G.803, G.812, G.813, G.823, G.824, G.8262 and/or many others. The nodes in a (telecommunication) network often receive timing information from an external, network wide reference. This can be a dedicated clock signal with very stable frequency, or it can be a data clock extracted from the incoming data communication links. This clock information is compared with the output clock signal from a local reference oscillator to determine the error-offset of this local reference oscillator. The local reference clock signal, corrected by the determined error-offset, is then used to generate the desired frequencies required by the transmitted communication links, and to maintain a system clock signal during periods of failure of the external reference clock signal (hold-over). This mechanism implies that the frequency stability of the system clock is tightly locked to the frequency stability of its local oscillator, even in the presence of an external reference clock signal. However, the output frequency of a typically used local oscillator is typically sensitive to temperature variations, which threaten the required stability. Although there exist oscillators such as Rubidium or atomic clocks which are more or less insensitive to temperature variations, those clocks are generally too expensive and/or too big in size to be used e.g. in nodes of communication networks.

SUMMARY

An object of embodiments of the invention is to provide a system for generating a system clock which is more stable than in prior art systems, and can cope with temperature variations.

According to embodiments of the invention, the system comprises a local oscillator, an obtaining module, a temperature detector, and a clock generator. The local oscillator is configured to generate a first clock signal. The obtaining module is configured to obtain a second clock signal. The temperature detector is configured to detect a temperature change above a critical value in an area including the local oscillator. The clock generator is configured to generate the system clock signal in a first manner, using the first clock signal, in a normal mode when the temperature detector does not detect a temperature change above the critical value, and in a second manner different from the first manner, using the second clock signal, in a reverse hold-over mode after the temperature detector has detected a temperature change above the critical value.

The obtaining module may be an extractor configured to extract a second clock signal from at least one external signal received at the system, but could e.g. also be a module for receiving a second clock signal from an area near the system, which area is not influenced by the temperature change.

Using such embodiments, in the presence of too steep temperature changes, it can be avoided that the resulting accuracy of the system clock signal deviates from the accuracy of the nominal frequency defined by a selected external reference clock, beyond the allowed tolerance, such that the system can comply with the required specifications, and in particular with e.g. specifications relating to ITU-T recommendations concerned with time keeping, or backhauling applications of wireless communications onto the core networks.

Embodiments of the invention are based on the insight that there are two problems to be addressed: a timely detection of temperature gradients in timing related parts of the system; and a proper reaction to such temperature gradients that cannot be compensated in timing related parts of the system.

The local oscillator may be an oven controlled crystal oscillator (OCXO), a temperature compensated crystal oscillator (TCXO), or any other suitable oscillator. An oven controlled oscillator or temperature crystal oscillator has an enhanced thermal inertia, as a local reference oscillator, depending on the required stability of the system. These OCXO and TCXO provide accurate and stable frequency outputs over a wide temperature range if the rate at which the environmental temperature changes is low, e.g. below 1° C. per minute. However, in some fault conditions, e.g. in case of fan failure or replacement of a fan tray, or in outside units, a temperature gradient much steeper than the 1° C. per minute may occur. Opening doors of the cabinets containing the telecommunications equipment may be another source of higher temperature gradients. In embodiments of the invention problems with steep temperature gradients are avoided by switching to a reverse hold-over mode when such a gradient is detected.

According to a preferred embodiment the local oscillator is configured to generate the first clock signal with a first frequency having a first temperature dependence, and the temperature detector comprises a further local oscillator adapted to generate a further clock signal with a second frequency having a second temperature dependence which is significantly higher than the first temperature dependence. The temperature detector may then further comprise a comparator for comparing the first clock signal with the further clock signal in order to detect a temperature change above a critical value. The comparator is preferably a phase comparator. The further local oscillator may be an oscillator, with a lower thermal inertia compared to the local oscillator, e.g. a cheap crystal oscillator.

According to a preferred embodiment, the clock generator is configured to generate the system clock signal in the first manner using the first clock signal as a master clock signal and a third clock signal for determining an error-offset value to be applied to the master clock signal to produce the system clock signal. The third clock signal may be the same as the second clock signal and is typically obtained by providing an extractor configured to extract a third clock signal from at least one external signal received at the system. The clock generator is then preferably configured to store the error-offset value when switching from the normal mode to the reverse hold-over mode, and to use this stored error offset value for generating the system clock signal when switching back from the reverse hold-over mode to the normal mode.

According to an embodiment of the invention, protection against a high temperature gradient, which may be detected by the means described above, or by another means to detect temperature changes, and which in either case affects the short term accuracy of the local oscillator, is to temporarily use a second clock signal directly extracted out of the best external reference, instead of the first clock signal, corrected by error-offset values as discussed above. This condition where the local oscillator is not used for a short period of time, but where one of the external references is directly used to generate the system clock corresponds with the reverse hold-over mode.

The clock generator may comprise a digital PLL to generate the system clock signal using an intermediate clock signal as a master clock signal and the second or third clock signal for determining an error-offset value to be applied to the master clock signal to produce the system clock signal, wherein the intermediate clock signal is generated in the first manner or in the second manner, depending on whether the clock generator operates in the normal or reverse hold-over mode. An example of such an embodiment is disclosed in FIG. 3.

The clock generator may comprise a PLL in series with a multiplexor, which are coupled between the output of the extractor and the master clock input of the digital PLL. The multiplexor has preferably a first input coupled to the local oscillator and a second input coupled to the output of the PLL, and is configured to select the first input in the normal mode, and to select the second input in the reverse hold-over mode. The PLL is preferably provided with a feedback loop with a feedback divider, said feedback loop being adapted to have a divider value which is dependent on the phase difference between the first clock signal and the output of the PLL in the normal mode, said feedback loop being further adapted to maintain said divider value constant when switching from the normal to the reverse hold-over mode.

According to an alternative embodiment the clock generator comprises a digital PLL to generate the system clock signal in the first manner using the first clock signal as a master clock signal and the second clock signal for determining a error-offset value to be applied to the master clock signal to produce the system clock signal generated in the first manner; and a switch-over module to switch between the system clock signal generated in the first and second manner. An example of such an embodiment is illustrated in FIG. 2. The switch-over module may be a hitless switch-over module comprising a PLL.

The system may comprise an internal clock synchronization sub-system which is constantly monitoring its external references to determine the quality, and validity of each reference, in order to find and select the best one. This may be based, amongst other means, on monitoring the frequency stability of the external reference.

According to another aspect of the invention there is provided a system for detecting a temperature change in an environment comprising a first oscillator. The system comprises the first oscillator which is configured to generate a first clock signal having a first frequency which changes in function of the temperature, and a second oscillator adapted to generate a second clock signal with a second frequency which changes faster with the temperature compared to the first frequency. Further the system comprises a comparator for comparing the first clock signal with the second clock signal in order to detect a temperature change. The first oscillator may e.g. be an oven controlled crystal oscillator or a temperature compensated crystal oscillator. The comparator is preferably a phase comparator. The second oscillator may be an oscillator with a lower thermal inertia compared to the first oscillator, and may e.g. be a cheap crystal oscillator without any temperature compensation.

According to an embodiment of the invention, sudden steep temperature gradients are detected using a very cheap, not at all temperature compensated second oscillator besides a more robust, less temperature sensitive regular first oscillator which forms the heart of the internal timing sub-system, and may be corrected by an external reference clock signal. A TCXO (Temperature Compensated Crystal Oscillator) or OCXO (Oven Controlled Crystal Oscillator) is typically used as the first oscillator with low temperature sensitivity. This extra cheap second oscillator will react very quickly to temperature changes, before the regular first oscillator will. Comparing the output signal of both will allow detecting and signaling such temperature changes, before they start affecting the regular first oscillator.

BRIEF DESCRIPTION OF THE FIGURES

The accompanying drawings are used to illustrate presently preferred non-limiting exemplary embodiments of systems and methods of the present invention. The above and other advantages of the features and objects of the invention will become more apparent and the invention will be better understood from the following detailed description when read in conjunction with the accompanying drawings, in which:

FIG. 1 illustrates an embodiment of a system 100 for producing a system clock signal according to the invention. The system 100 comprises a local oscillator 110 configured to generate a first clock signal 111. The local oscillator is e.g. an oven controlled crystal oscillator or a temperature compensated crystal oscillator. Further, the system comprises an obtaining module 120 which is configured to obtain a second clock signal 121. Also there is provided an extractor 180 to extract a third clock signal 181 from at least one external signal 122 received at the system 100. Note that the second clock signal could be the same as the third clock signal, in which case the obtaining module 120 and the extractor 180 are the same module, see also the exemplary embodiments of FIGS. 2 and 3 discussed below. The extractor may be configured to extract from a number of external signals 122 a quality of a clock signal included in the external signal. Using this quality, the extractor may extract the best external signal and decide to use the clock signal of this best external signal as the third clock signal 181.

Figure 1:
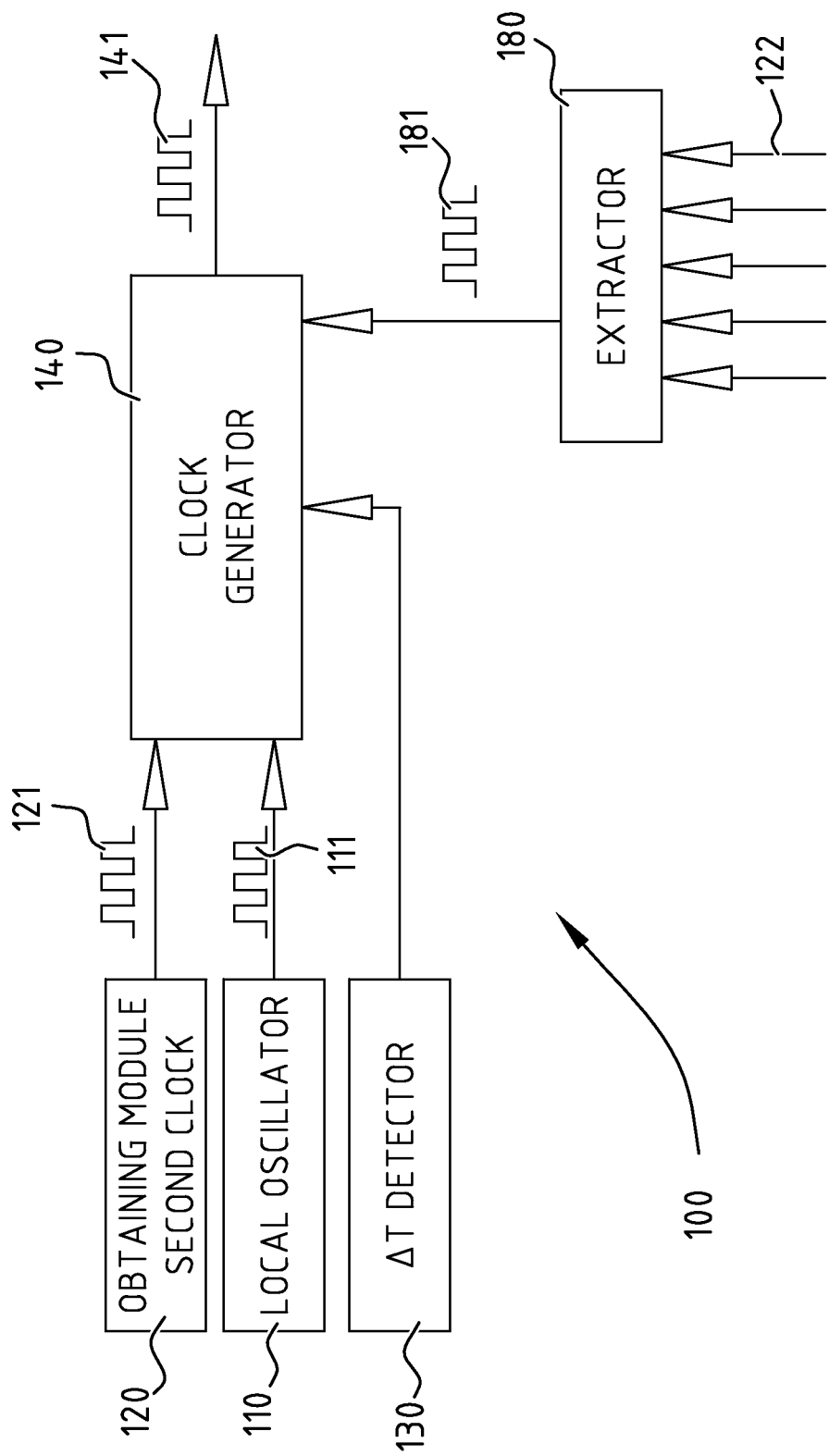
FIG. 1 illustrates schematically a first embodiment of a system of the invention.

Further, the system 100 comprises a temperature detector which is configured to detect a temperature change above a critical value in an area including the local oscillator 110. When no significant temperature change is detected the system operates in a normal mode, and upon detecting a significant temperature variation the system switches to a reverse hold-over mode. The detector 130 may be further adapted to decide to remain in the reverse hold-over mode for a minimum period of time in which period the systems needs to be stable, i.e. in which period no further significant temperature variations may be detected, before the system may switch back to the normal mode. The temperature detector 130 provides a detection signal to a clock generator 140 to indicate whether a temperature change above the critical value has been detected, i.e. whether to change from the normal to the reverse hold-over mode.

The clock generator 140 is provided with the first clock signal 111 from the local oscillator 110 and with the second clock signal 121 from the extractor 120. Using this first and second clock signal, the clock generator 140 generates a system clock signal 141. The clock generator 140 is adapted to generate the system clock signal 141 in a first manner when no temperature change above the critical value is detected, and in a second manner when a temperature change above the critical value is detected. According to the first manner, the first clock signal 111 is used to generate the system clock 141, wherein the second clock signal 121 may be used to correct the first clock signal 111. According to the second manner, the second clock signal 121 is used to generate the system clock signal 141.

Figure 2:
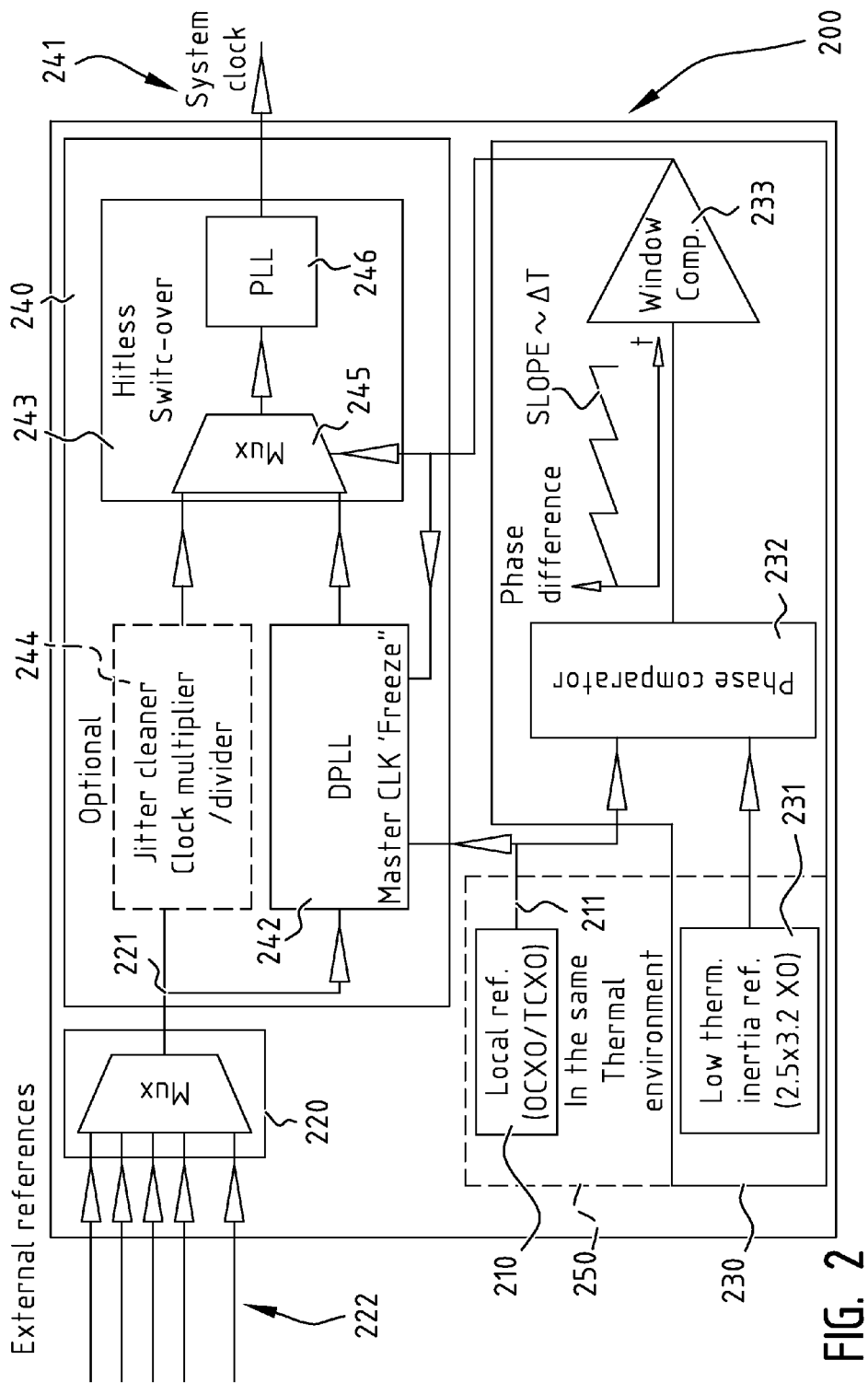
FIG. 2 is a schematic diagram of a second embodiment of a system of the invention.

FIG. 2 illustrates a more detailed second embodiment of a system 200 of the invention. The system 200 comprises a local oscillator 210, e.g. running at 10 MHz, an extractor 220 for extracting a second clock signal from an external signal, a temperature detector 230, and a clock generator 240 for generating a system clock. The second clock signal may e.g. be running at 100 MHz, while the system clock signal could be running at 200 MHz.

The temperature detector 230 comprises a further local oscillator 231 having a low thermal inertia compared to the local oscillator 210. The output of the local oscillator 210 and of the further oscillator 231 are fed into a phase comparator 232. The local oscillator 210 and the further oscillator 231 are placed in the same thermal environment 250. When the temperature in this local environment 250 changes, because of the lower thermal inertia of the further oscillator 231, the frequency of the signal generated by the further oscillator 231 will change faster compared to the local oscillator 210. The phase comparator 231 evaluates the difference in phase between the signal from the local oscillator 210 and from the further oscillator 231 in function of the time. When the slope of the phase difference in function of the time changes, this is indicative of a temperature change in the thermal environment 250. As illustrated in FIG. 2, from the output of the phase comparator 231, the window comparator 233 can determine whether the temperature change in the thermal environment 250 is higher than a critical value. This result is communicated to the clock generator 240. The local oscillator 210 may be protected against temperature changes to some extent, while the further oscillator 230 may be a standard cheap crystal oscillator which is not protected against temperature changes. A frequency difference is constantly being monitored using the phase comparator 232, and when this frequency difference suddenly changes, this is an indication that a temperature gradient is present. The amount of the sudden frequency change is a measure of the temperature gradient and allows assessment of whether the frequency of the first clock signal will be affected by the temperature change or not. The skilled person will understand that instead of using a crystal oscillator any other suitable oscillator may be used.

The clock generator 240 comprises an optional processing block 244 which is configured for multiplying or dividing the frequency of the second clock signal 221 with a predetermined factor and/or for cleaning jitter in the second clock signal 221. In the example of having a second clock signal 221 of 100 MHz and a system clock 241 of 200 MHz, a multiplier "2" will be used. Further, the clock generator 240 comprises a digital PLL 242 which uses the first clock signal 211 as a master clock signal or base clock. This master clock signal is multiplied with a correction factor which is determined using the second clock signal 221 derived from the one or more external references. The output of the digital PLL 242 is fed into a hitless switchover block 242 which performs a hitless switchover. The hitless switchover block 243 uses the output of the temperature detector 230 to determine how to set a multiplexer 245. When no critical temperature change is detected, the output of the DPLL 242 is passed by the multiplexer 245 to a PLL 246, and the system clock will be equal to the output of the DPLL 242. When a critical temperature change is detected, the multiplexer switches, and allows the output of the processing block 244 to be fed in the PLL 246. The PLL 246 will ensure that when a switching of the multiplexer 245 takes place, the transition from the output signal of the DPLL 242 to the output of the processing block 244 en vice versa happens smoothly by adjusting the phase. The hitless switchover block 242 may be further provided with a button to perform a manual switchover of the multiplexer 245. In that way, when a critical temperature change is expected, e.g. because of maintenance operations to the cabinet, it can be decided to use the second clock signal 221 from the external references instead of the first clock signal 211 from the local oscillator 210.

Figure 3:
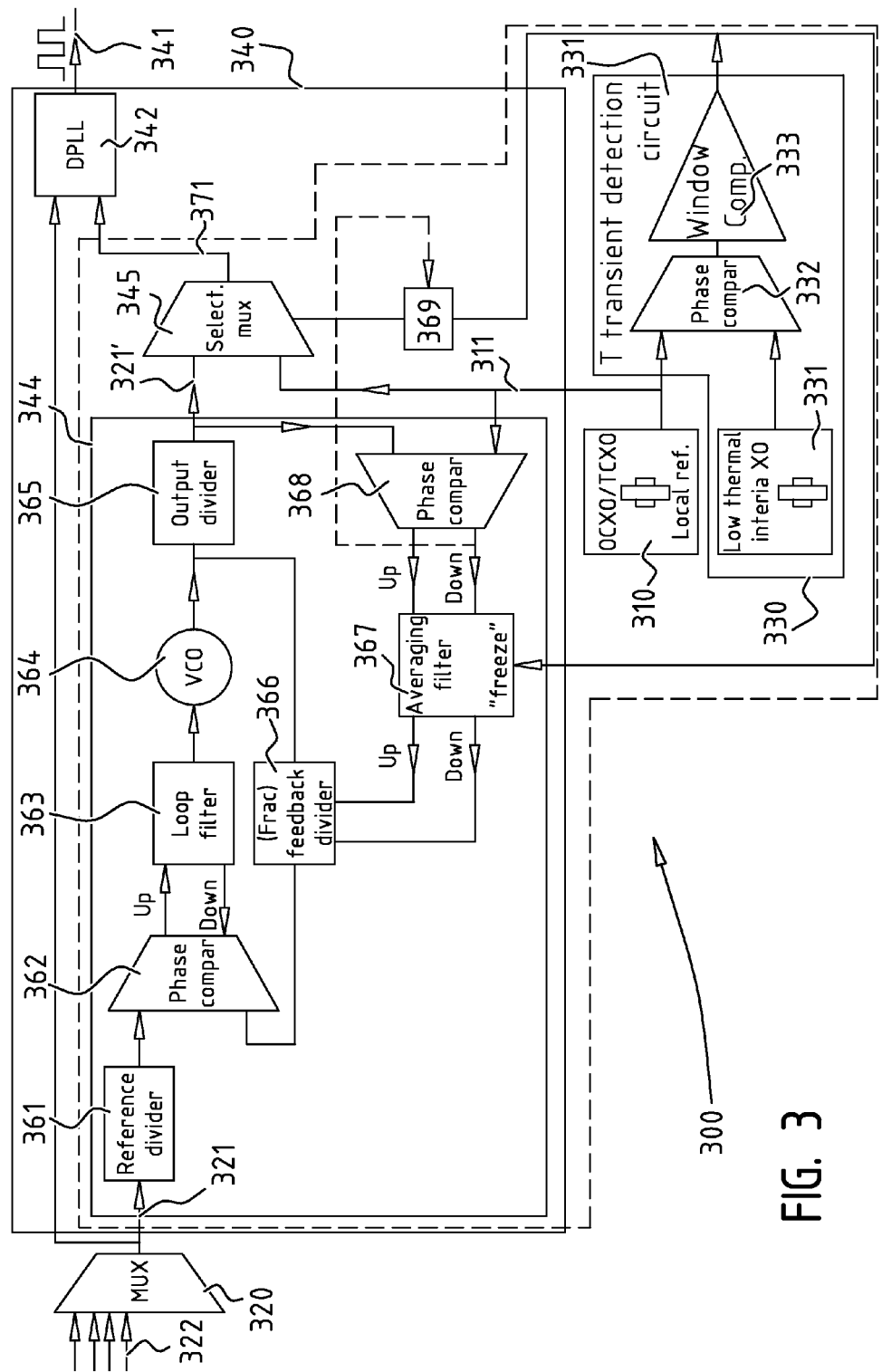
FIG. 3 is a schematic diagram of a third embodiment of a system of the invention.

FIG. 3 illustrates a third embodiment of a system 300 of the invention. The system 300 comprises a local oscillator 310, an extractor 320, a temperature detector 330, and a clock generator 340. The temperature detector 330 is identical to the temperature detector 230 described above with reference to FIG. 2, and hence a detailed description thereof has been omitted. As in the embodiment of FIG. 2, the temperature detector 330 comprises an oscillator 331 having a low thermal inertia compared to the local oscillator 310, a phase comparator 332, and a window comparator 333.

The clock generator 340 comprises a multiplexer 345 which will allow the first clock signal 311 of the local oscillator 310 to pass as the master clock signal 371 to the input of a digital PLL 342, when no critical temperature change has been detected by the temperature detector 330. The clock generator 340 further comprises a processing block 344 which is adapted to ensure that the second clock signal 321 derived from one or more external reference signals 322 is in phase with the first clock signal 311. Further, the processing block 344 may be adapted to multiply or divide the second clock signal 321 with a suitable factor. This processed second clock signal is fed into the multiplexor 345, and will be selected by the multiplexor 345 when the detected temperature change is above a critical value. Also, when detecting the critical change the settings of the feedback loop of processing block 344 will be frozen, see further, so that the first clock signal no longer influences the processed second clock signal. In that way the master clock signal that is fed in the DPLL 342 will be either the first clock signal 311 or the processed second clock signal 321' depending on whether a critical temperature change has been detected. When the temperature has become stable again, the multiplexor may switch back to the first clock signal. To ensure a smooth transition back, a delay may be introduced, see block 369, so that the switching is done when there is no phase difference between the first clock signal 311 and the processed second clock signal 321', which will be detected by the phase comparator 368. The DPLL 342 corrects the master clock signal 371, being either the first clock signal 311 or the processed second clock signal 321' depending on whether a critical temperature change has been detected, with a correction factor which is determined using the second clock signal 321 derived from the one or more external references 322.

The processing block 344 comprises a reference divider 361, a phase comparator 362, a loop filter 363 having a high bandwidth, a VCO 364, an output divider 365 and a feedback divider 366. The reference divider 361 and the output divider 365 are typically configured at fixed values. In normal operation, i.e. when no critical temperature is detected, the feedback divider 366 is configured with a value which is dependent on the phase difference between the first clock signal 311 and the output 321' of the PLL 344, using phase comparator 368 and averaging filter 367. In that way the PLL's output 321' can be brought to be in phase with the first clock signal 311. This will allow a so-called hitless switch-over in a temperature gradient is detected. Further, when a temperature gradient is detected, the parameters of the averaging filter 367 are frozen until the temperature is again stable.

In this third embodiment, at the entrance of the DPLL 342, the first clock signal 311 from the local oscillator 310 is replaced with a clock 321' of the same frequency and phase, but derived directly from the selected external reference clock, through a VCO 364 with high bandwidth. The oscillator in this VCO 364 will also be suffering from the temperature effects that invalidate the local oscillator 310 as local reference, but the impact of this on the VCO output will be neutralized by virtue of the high bandwidth commodity of the loop filter 363, which will make it track accurately the stable external reference clock 321, despite changes in the control voltage to frequency characteristic of the VCO 364. This third embodiment may provide an even better system clock behavior, as the system clock remains generated by the DPLL 342 in both situations, only using a different input base clock 371 for each situation.

A skilled person will notice that processing block 344 is actually a DPLL which uses the second clock signal 321 as a master clock to produce the processed second signal 321' which is in frequency and phase identical to the first clock signal 311 produced by the local oscillator 310 for as long as no harmful temperature gradient was detected. Therefore processing block 344 may be replaced by any other known DPLL with the similar functionality.

Where in the embodiments disclosed above reference is made to a divider or a multiplier, the skilled person will understand that this divider/multiplier may be a divide/multiply with "1", and that a divider may be a multiplier and vice versa.

The above discussed extractor and clock generator modules may be implemented using hardware and/or software components as will be apparent to the skilled person.

For all illustrated embodiments, it is typically assumed that the probability of simultaneous occurrence of unacceptable deviations of the selected external reference clock, as well as changes in the local system temperature, is very low, and below the required availability or up-time for the system. Under this condition, the described embodiments will protect against each of both types of failure, whereas prior art embodiments only protect against deviations in the selected external reference clock, and require a stable local oscillator clock at all times.

Timing dependent systems containing conventional temperature sensors and switches, have the following disadvantage compared to embodiments of the present invention. Such sensors and switches are intended for regulating its cooling, and for protection (preventive power down) of the equipment against overheating. These sensors are of little use for detecting the kind of temperature variations that may impair the internal timing logic of such systems in time, and hence for protecting against such variations. The temperature gradient detection of preferred embodiments of the invention only requires one low cost crystal oscillator and a very small additional silicon area for implementing the phase comparator and window comparator, and can report temperature gradients before they affect the local oscillator.

Whilst the principles of the invention have been set out above in connection with specific embodiments, it is to be understood that this description is merely made by way of example and not as a limitation of the scope of protection which is determined by the appended claims.

The invention claimed is:

1. A system for producing a system clock signal comprising:
   a local oscillator configured to generate a first clock signal;
   a temperature detector configured to detect a temperature change in an area including the local oscillator;
   a module configured to obtain a second clock signal, the second clock signal being obtained from at least one external signal received at the system;
   a clock generator configured to generate the system clock signal,
      using the first clock signal, in a normal mode when the temperature detector does not detect a temperature change above a critical value, and
      using the second clock signal, in a reverse hold-over mode, in response to detecting by the temperature detector, the temperature change above the critical value.

2. The system of claim 1, wherein the second clock signal is not influenced by the temperature change.

3. The system of claim 1, wherein the local oscillator is an oven controlled crystal oscillator or a temperature compensated crystal oscillator.

4. The system of claim 1, wherein
   the local oscillator is configured to generate the first clock signal with a first temperature dependence, and
   the temperature detector includes,
      another local oscillator configured to generate a third clock signal with a second temperature dependence which is higher than the first temperature dependence, and
      a comparator for comparing the first clock signal with the third clock signal in order to detect a temperature change above the critical value.

5. The system of claim 4, wherein the comparator is a phase comparator.

6. The system of claim 1, further comprising:
   an extractor configured to extract a third clock signal from at least one external signal received at the system; and
   wherein the clock generator is further configured to generate the system clock signal using the first clock signal as a master clock signal and the third clock signal as a signal for determining an error offset value to be applied to the master clock signal to produce the system clock signal.

7. The system of claim 6, wherein the clock generator is further configured to,
   store the error offset value when switching from the normal mode to the reverse hold-over mode, and
   use the error offset value for generating the system clock signal when switching back from the reverse hold-over mode to the normal mode.

8. The system of claim 6, wherein the clock generator comprises:

a digital phase-locked loop (PLL) configured to use an intermediate clock signal as a master dock signal and the second or the third clock signal as a signal for determining a correction factor to be applied to the master clock signal to generate the system clock signal, wherein the intermediate clock signal is generated depending on whether the clock generator operates in the normal mode or in the reverse hold over mode.

9. The system of claim 8, wherein the clock generator comprises:
   a PLL in series with a multiplexer, which are coupled between an output of the extractor and the digital PLL, said multiplexer having a first input coupled to the local oscillator and a second input coupled to an output of the PLL, said multiplexer being configured to,
   select the first input in the normal mode, and
   select the second input in the reverse hold over mode; and
   a feedback loop with a feedback divider for said PLL, said feedback loop being configured to have a divider value which is dependent on a phase difference between the first clock signal and the output of said PLL in the normal mode, said feedback loop being further configured to maintain said divider value constant when switching from the normal to the reverse hold over mode.

10. The system of claim 1, wherein the clock generator comprises:
    a digital phase-locked loop (PLL) configured to use the first clock signal as a master clock signal and the second clock signal as a signal for determining a correction factor to be applied to the master clock signal to generate the system clock signal; and
    another module configured to switch between the system clock signal generated based on the temperature change being above or below the critical value.

11. The system of claim 10, wherein the other module is a hitless switch-over module.

12. A system for detecting a temperature change in an environment, the system comprising:
    a first oscillator configured to generate a first clock signal having a first frequency which changes with a temperature of an area, and
    a second oscillator configured to generate a second clock signal with a second frequency which changes faster with the temperature compared to the first frequency; and
    a phase comparator configured to compare the first frequency of the first clock signal with the second frequency of the second clock signal in order to detect the temperature change.

13. The system of claim 12, wherein the first oscillator is an oven controlled crystal oscillator or a temperature compensated crystal oscillator.

14. The system of claim 12, further comprising:
    another comparator configured to evaluate a change in a rate at which a phase difference determined by the phase comparator changes.

* * * * *